United States Patent [19]

Carbaugh et al.

[11] Patent Number: 4,734,157

[45] Date of Patent: Mar. 29, 1988

[54] SELECTIVE AND ANISOTROPIC DRY ETCHING

[75] Inventors: Susanna R. Carbaugh, Manassas; Hung Y. Ng, Brooklyn; Murty S. Polavarapu; David Stanasolovich, both of Manassas, all of Va.

[73] Assignee: International Business Machines Corporation, Armonk, N.Y.

[21] Appl. No.: 27,458

[22] Filed: Mar. 18, 1987

Related U.S. Application Data

[63] Continuation of Ser. No. 769,647, Aug. 27, 1985, abandoned, and a continuation of Ser. No. 769,832, Aug. 27, 1985, abandoned.

[51] Int. Cl.$^4$ ................. B44C 1/22; H01L 21/308; C23F 1/12
[52] U.S. Cl. ................. 156/643; 156/646; 156/656; 156/657; 156/662; 156/659.1; 252/79.1
[58] Field of Search ............ 156/643, 646, 653, 656, 156/657, 659.1, 662; 252/79.1

[56] References Cited

U.S. PATENT DOCUMENTS

| 3,940,506 | 2/1976 | Heinecke ............................. 427/38 |
| 3,984,301 | 10/1976 | Matsuzaki et al. ............ 204/192.32 |
| 4,208,241 | 6/1980 | Harshbarger et al. ............. 156/643 |
| 4,211,601 | 7/1980 | Mogab ................................. 156/643 |
| 4,283,249 | 8/1981 | Ephrath ............................. 156/643 |
| 4,326,911 | 4/1982 | Howard et al. ..................... 156/643 |
| 4,352,724 | 10/1982 | Sugishima et al. ............. 156/643 X |
| 4,353,777 | 10/1982 | Jacob ................................. 156/643 |
| 4,397,724 | 8/1983 | Moran ............................ 156/643 X |
| 4,412,119 | 11/1983 | Komatsu et al. ............... 156/643 X |
| 4,427,516 | 1/1984 | Levinstein et al. ............ 156/643 X |
| 4,431,477 | 2/1984 | Zajac ................................ 156/643 |
| 4,444,617 | 4/1984 | Whitcomb ......................... 156/643 |
| 4,465,552 | 8/1984 | Bobbio et al. ..................... 156/643 |
| 4,473,436 | 9/1984 | Beinvogl ........................... 156/643 |
| 4,528,066 | 7/1985 | Merkling et al. .................. 156/643 |

FOREIGN PATENT DOCUMENTS 54-54578 4/1979 Japan ................................. 156/643

OTHER PUBLICATIONS

Bondur et al., "RF Reactive Ion Etching of Polysilicon with Fluorocarbon Gas", IBM T.D.B., vol. 18, No. 6, p. 1897 (Nov. 1975).
Bennett, "Highly Selective Etching of $SiO_2$ using $CClF_3+H_2$, IBM T.D.B., vol. 25, No. 9, p. 4589 (Feb. 1983).
Leahy, "Directional Plasma Etching of Polysilicon in a $CF_3Cl$ Discharge", Electrochemical Soc. 1981 meeting, Abstract #271.
Mogab et al., "Anisotropic Plasma Etching of Polysilicon", J. Vac. Sci. Technol., 17(3), May/June 1980, pp. 721–730.

Primary Examiner—S. Leon Bashore
Assistant Examiner—Andrew J. Anderson
Attorney, Agent, or Firm—Jeffrey S. LaBaw; John E. Hoel; Maurice H. Klitzman

[57] ABSTRACT

A composition and method for anistropically etching polysilicon or silicides with excellent selectivity to an underlying layer of an oxide or nitride of silicon is disclosed. A mixture of $CClF_3$ or $CCl_2F_2$ and ammonia is employed at moderate pressures in a reactive ion etching chamber.

26 Claims, 15 Drawing Figures

SELECTIVE AND ANISOTROPIC DRY ETCHING

This application is a continuation of application Ser. No. 769,647, filed Aug. 27, 1985 and application Ser. No. 769,832, filed Aug. 27, 1985, both now abandoned.

DESCRIPTION

1. Field of the Invention

This invention relates to a composition and method for reactive ion etching.

2. Background of the Invention

The manufacturing of semiconductor devices usually involves the patterned etching of specific layers comprising the device. This etching can be done in a variety of ways. Formerly, such etching was done with wet chemicals. These processes have a number of disadvantages. The etching is isotropic, that is, etching occurs laterally as well as vertically resulting in an etched linewidth which is larger than the resist image. Furthermore, the chemicals used are typically very hazardous to personnel and undesirably polluting. Finally, the etching step must be followed by a rinse and dry step. The additional steps increase processing time and decrease yield.

More recent processes employ gas plasmas. Because the gases are contained within a sealed reaction chamber there is no hazard to personnel. Much smaller quantities of etchant are used and the gaseous nature of the effluent allows for "scrubbing" to remove pollutants. Not only are the rinse and dry steps removed, but resist removal can be performed in the chamber after completion of the etching. Processing time is decreased and yield is increased.

If the use of a gas plasma to etch is combined with the technique of accelerating the etchant species toward the article being etched, the technique is known as Reactive Ion Etching (RIE). In addition to the advantages gained by use of a gas plasma, etching performed in this way can be anisotropic, that is predominantly vertical. The degree of anisotropy is largely determined by the pressure. The lower the pressure the more anisotropic the etching. This is because at low pressures particles in the chamber have a long mean free path. As particles are accelerated toward the surface being etched they are less likely to collide with other particles. Collisions with other particles change the direction of the particle with the result that the vertical surfaces are more likely to be attacked at high pressures than at low pressures.

However, selectivity is another factor which must be considered. A perfectly selective process would be one in which the overlying layer would etch and the underlying layer would not. In real life this is never achieved. Selectivity is expressed as a ratio of the etch rate of the overlying layer to the etch rate of the underlying layer. In general, the lower the pressure the less selective the etching. This is because the particles have high kinetic energy with the result that non-selective physical etching by particle bombardment occurs along with selective chemical etching.

One area of semiconductor manufacturing in which dry etching has been used is in patterning a layer of polysilicon or refractory metal silicide which overlies an insulating layer such as silicon dioxide, silicon nitride, or silicon oxynitride. A specific example is the definition of polysilicon or polycide gate electrodes in the manufacturing of (MOSFET) devices. Many etch formulations have been proposed which vary in their selectivity and anisotropy. One gas which has been tried is $CClF_3$.

Although $CClF_3$ has been used at relatively high pressures (greater than 100 millitorr) to etch polysilicon over silicon dioxide with excellent selectivity, the etching has not been anisotropic. FIG. 1 shows the etched profiles of N+ polysilicon etched at various pressures in pure $CClF_3$. Excessive undercutting can be seen at 100 mTorr, as well as at much lower pressures. In pure $CClF_3$ at higher pressures there is thought to be an excess of $Cl^-$ species over unsaturate species, $CF_x^+$. These chlorine species are low energy because of the high pressure and reduced mean free path. They diffuse in random directions and attack both vertical and horizontal surfaces of the layer being etched. Therefore, this process produces substantial undercutting and has a poor directionality.

A low pressure (25 millitorr) RIE process has been developed for etching $SiO_2$ with respect to silicon. This involves the addition of molecular hydrogen to $CClF_3$. The addition of molecular hydrogen serves to getter the excess chlorine. This enhances the relative quantity of $CF_x^+$ in the ambient. At low pressures, $CF_x^+$ etches $SiO_2$ and because there is so little chlorine in the ambient, silicon does not etch.

Another gas which has been tried is $CCl_2F_2$. A process employing $CCl_2F_2$ and argon has been used to etch polysilicon overlying $SiO_2$ at moderate pressure. The selectivity of the process is low (7:1) and it is not anisotropic.

A two-step process has been disclosed for etching layers of molybdenum silicide and polysilicon overlying $SiO_2$. Two different etch formulations are required for the two steps. The second etchant which is used to etch the polysilicon comprises $CCl_2F_2$ and $C_2F_6$.

Pure $CCl_2F_2$ has also been used to etch polysilicon overlying $SiO_2$. However, the selectivity of the process is very low, especially at low power density where it approaches 2:1.

SUMMARY OF THE INVENTION

It is an object of this invention to provide an improved process for the dry etching of silicon or silicides.

It is a further object of this invention to provide a process for the dry etching of polysilicon or silicides which is both anisotropic and selective to an underlying layer of an oxide or nitride of silicon.

It is another object of this invention to provide an anisotropic selective process for the dry etching of polysilicon or silicides which can be carried out at moderate to high pressures and low power density.

Other objects will be apparent to those skilled in the art to which this invention pertains.

In accordance with the invention, a mixture of $CClF_3$ or $CCl_2F_2$ with ammonia is employed at moderate pressures in a reactive ion etching chamber to anisotropically etch polysilicon or silicides with excellent selectivity to an underlying layer of an oxide or nitride of silicon.

BRIEF DESCRIPTION OF THE DRAWINGS

FIG. 1a shows the profile obtained at 22 mtorr. FIG. 1b shows the profile obtained at 60 mtorr. FIG. 1c shows the profile obtained at 100 mtorr.

FIG. 4a shows the effect of pure CClF$_3$. FIG. 4b shows the effect of 20% NH$_3$ in CClF$_3$ (v/v). FIG. 4c shows the effect of 30% NH$_3$ in CClF$_3$ (v/v). FIG. 4d shows the effect of 50% NH$_3$ in CClF$_3$ (v/v).

FIG. 5a shows the effect of pure CClF$_3$. FIG. 5b shows the effect of 20% NH$_3$ in CClF$_3$ (v/v). FIG. 5c shows the effect of 50% NH$_3$ in CClF$_3$ (v/v).

FIG. 6a shows pure CCl$_2$F$_2$. FIG. 6b shows 33.3% NH$_3$ by volume in CCl$_2$F$_2$. FIG. 6c shows 37.5% NH by volume in CCl$_2$F$_2$.

DESCRIPTION OF THE PREFERRED EMBODIMENTS

1. Terminology

Elemental Silicon-containing layers: This refers to layers containing elemental silicon. These layers may be single crystal or polycrystalline. They may be doped to either conductivity type at any level. Silicon may be contained as part of an intermetallic compound such as a silicide of a refractory metal such as molybdenum, tungsten, titanium or tantalum.

Covalent Silicon-containing compounds: This refers to chemical compounds containing silicon covalently bonded to other elements, such as nitrogen or oxygen. Such compounds include silicon oxide, silicon dioxide, silicon nitride, and silicon oxynitride.

Plasma etching: Etching which proceeds by means of a plasma generated by an RF discharge. The predominant removal mechanism is chemical reaction.

Ion Beam Etching: Etching which proceeds by means of accelerated species bombarding the surface to be etched. The predominant removal mechanism is physical momentum transfer. Also called ion milling or sputter etching.

Reactive Ion Etching: Etching which proceeds by means of a plasma in which the reactant species are accelerated toward the surface to be etched. The removal mechanism is a combination of chemical and physical interactions between the accelerated species and the surface.

Etch Profile: Wall configuration produced in an etched structure, which may be:

Vertical—straight walls on a plane with the resist edge and perpendicular to the surface of the substrate.

Undercut—sloped walls in which some portion of the wall lies under the resist.

Isotropic: Etching which proceeds at a uniform rate in all directions (both vertically and laterally). It results in undercutting in which the etched region closest to the resist undercuts to a dimension approximately equal to that of the vertical etch dimension.

Anisotropic: Etching which is directional; that is, which proceeds faster in the vertical direction than in the lateral direction. Ideal anisotropic etching produces a vertical etch profile.

Selectivity: The preferential etching of one substance over another which is a result of differences in the rate of chemical reaction between the etchant and each of the substances. It is expressed as the ratio of the etch rates of two adjacent layers (ERR).

2. Apparatus

Figure 1A:
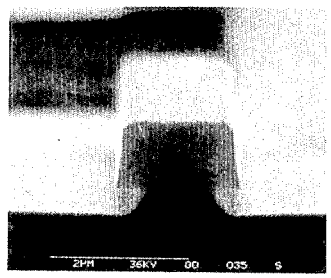
FIGS. 1a, 1b and 1c are a series of SEMs showing the etched profiles of N+ polysilicon etched in pure $CClF_3$ at various pressures.
Figure 1A:
Figure 1B:
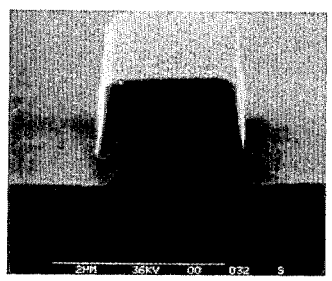
Figure 1B:
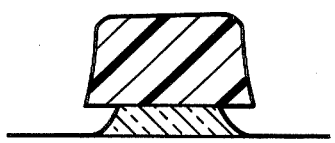
Figure 1C:
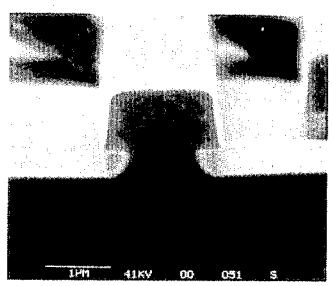
Figure 1C:
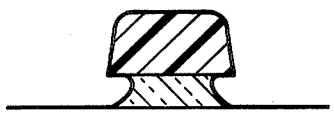
Figure 2:
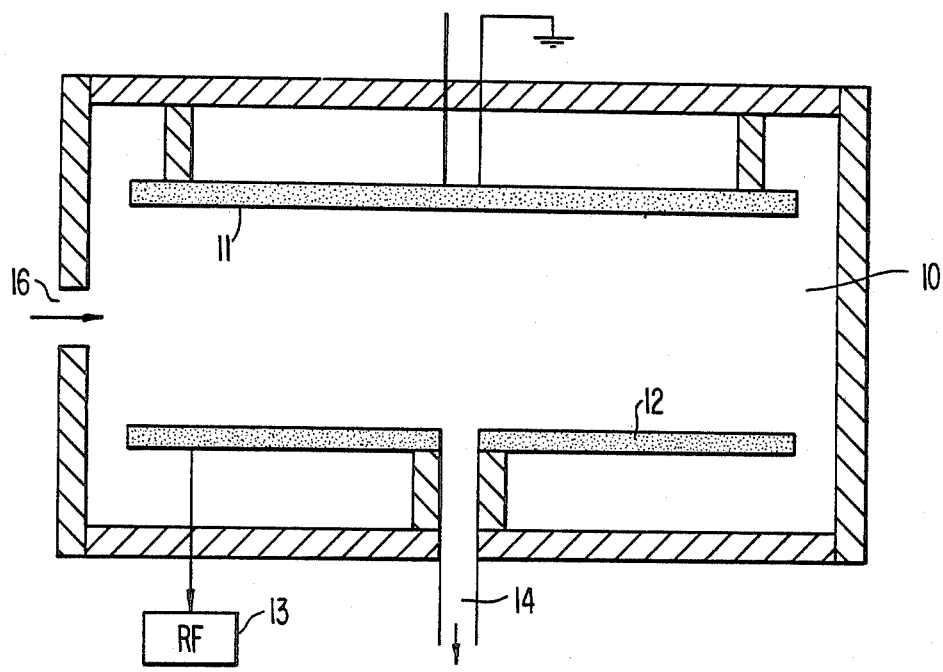
FIG. 2 is a schematic cross-sectional view of apparatus which can be used to carry out the process of the present invention.

A typical reactive ion etching system is shown in FIG. 2. It comprises etching chamber 10 containing parallel plate electrodes 11 and 12. In this configuration, upper electrode 11 is grounded. Lower electrode 12 is powered by RF generator 13. Either or both electrodes may be water cooled and the distance between them may be adjustable. In a plasma etching system (not shown), the system configuration is similar, but the lower electrode is grounded and the upper electrode is powered.

Etching chamber 10 is evacuated via exhaust pipe 14 by pumping means (not shown). Etchant gas is supplied to etching chamber 10 through gas inlet 16. The system may have multiple gas channels. The flow of the reactive gases can be controlled by pressure and/or flow-rate servo systems.

By introducing a suitable gas or gas mixture into chamber 10 and establishing an electrical field between upper electrode 11 and lower electrode 12, a reactive plasma is generated. The plasma is characterized by a uniform dark space in the immediate vicinity of cathode 12. Volatile products formed during the etching process are exhausted from chamber 10 via exhaust pipe 14.

3. Etchant

The etchant gas mixture employed according to the present invention comprises:

a. a gaseous fluorocarbon capable of supplying CFx and chlorine ions, and b. a gas capable of supplying hydrogen ions.

The preferred gaseous fluorocarbons are CClF$_3$ and CCL$_2$F$_2$ and the preferred source of hydrogen ions is ammonia. The ammonia is employed in an amount effective to increase the selectivity, e.g. in a CClF$_3$:NH$_3$ ratio (v/v) or CCl$_2$F$_2$: NH$_3$ ratio (v/v) of about 80:20 to about 35:65.

It is theorized that at 100 millitorr with pure CClF$_3$ there is an excess of chlorine ions over unsaturate species, CFx. As noted above, this excess chlorine diffuses in random directions and attacks both vertical and horizontal surfaces producing substantial undercutting. The addition of hydrogen ions to CClF$_3$ removes the excess of chlorine ions and balances the concentration of CFx ions relative to chlorine ions. Ammonia is preferred over hydrogen gas as the source of hydrogen ions for two reasons. First, ammonia gas provides a much broader process window than hydrogen gas. This is important because if too much hydrogen is added, too much chlorine will be removed and unsaturate species, CFx, will predominate. The result of removing too much chlorine will depend on the pressure. At relatively high pressures, the unsaturate species, CFx, have low energy and coat out as a polymer on all exposed surfaces. The net result is a coating process instead of an etching process. At relatively low pressures, the unsaturate species, CFx, have high energy. As noted above, the addition of hydrogen to CClF$_3$ at low pressure (25 millitorr) actually produces a process which can be viewed as the opposite of the present invention, i.e. the process will preferentially etch $SiO_2$ over Si, whereas the process of the present invention will preferentially etch Si over $SiO_2$. The $CClF_3/H_2$/low pressure process etches $SiO_2$ because of the predominance of high energy $CF_x$ species which are $SiO_2$ etchants. The second reason that ammonia is preferred over hydrogen gas as the source of hydrogen ions is because ammonia produces active nitrogen which is a polymer inhibitor. This gives the added benefit of a reduction in polymer formation. Of course, some polymer will still form on exposed surfaces. That which forms on horizontal surfaces will be removed by the chlorine species in a properly balanced mixture. That which forms on the sidewalls will not be attacked by the accelerated chlorine species and will further reduce the lateral etching which results in undercutting.

With $CClF_3$ it is sometimes desirable to employ an etchant gas mixture containing an inert gas. In this case, the ratio of $CClF_3$ to ammonia is kept the same as in the composition without inerts. Inerts increase etch uniformity and help to cool the chamber. Examples of inerts which may be used are the noble gases, especially helium.

4. Substrate

Figure 3:
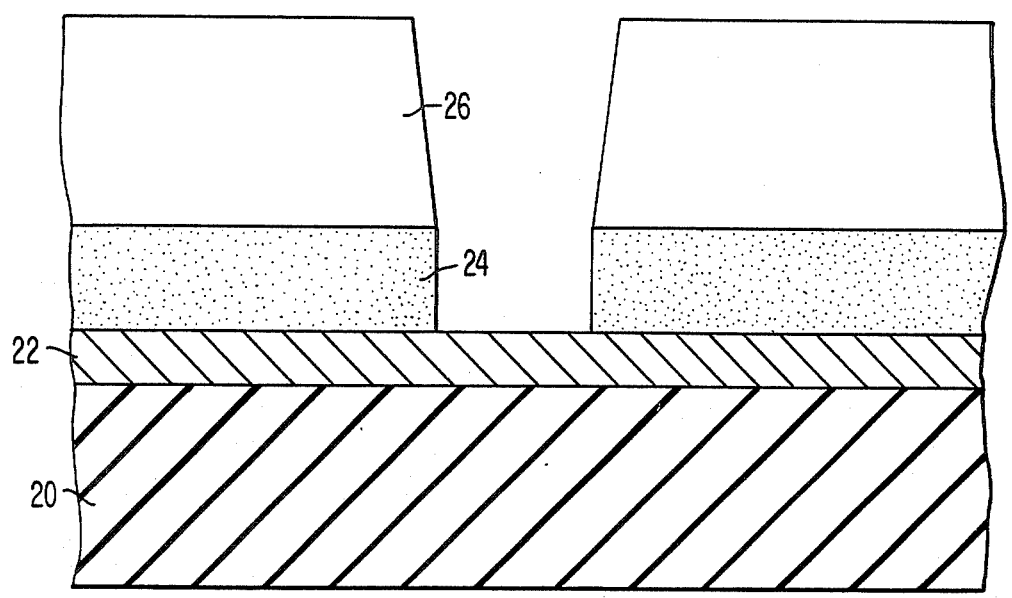
FIG. 3 is a schematic enlarged cross-sectional view of a substrate on which the process of this invention has been practiced.
Figure 4A:
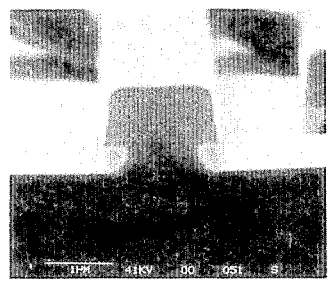
FIGS. 4a, 4b, 4c and 4d are a series of SEMs showing the effect of the %NH$_3$ on the etched profiles of N+ polysilicon at 100 mTorr.
Figure 4A:
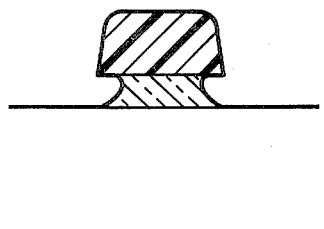
Figure 4B:
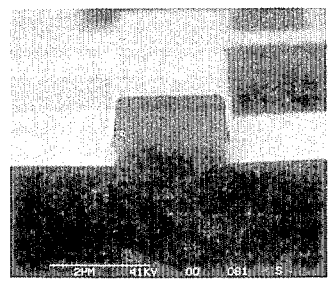
Figure 4B:
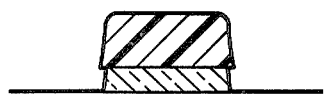
Figure 4C:
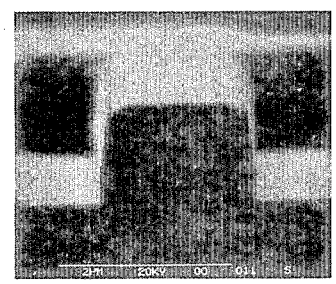
Figure 4C:
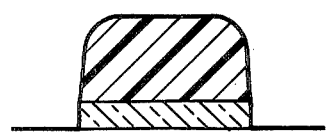
Figure 4D:
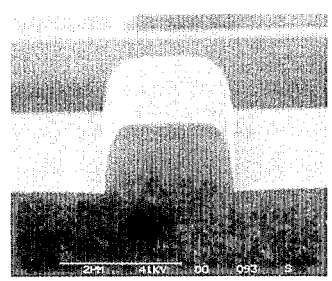
Figure 4D:
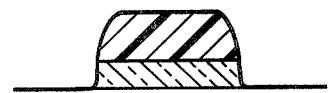
Figure 5A:
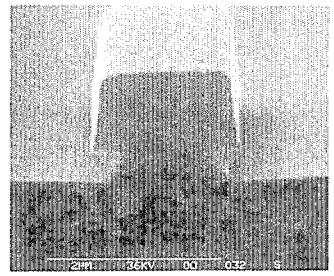
FIGS. 5a, 5b and 5c are a series of SEMs showing the effect of the %NH$_3$ in CClF$_3$ on the etched profiles of N+ polysilicon at 60 mTorr.
Figure 5A:
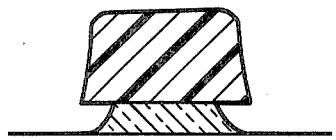
Figure 5B:
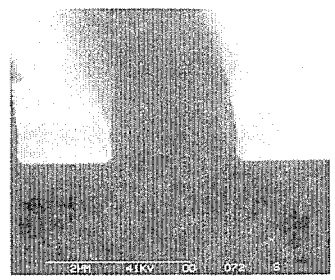
Figure 5B:
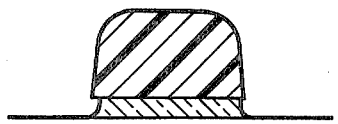
Figure 5C:
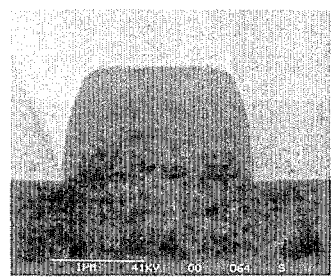
Figure 5C:
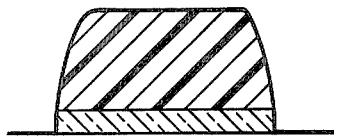
Figure 6A:
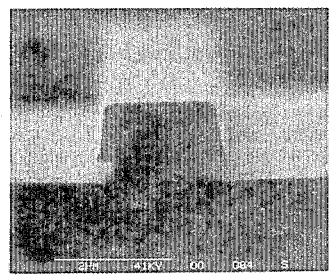
FIGS. 6a, 6b, and 6c are SEMs showing the effect of the %NH$_3$ in CCl$_2$F$_2$ on the etched profiles of N+ polysilicon at 70 mTorr.
Figure 6A:
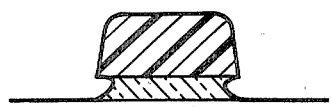
Figure 6B:
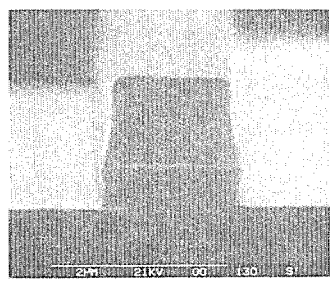
Figure 6B:
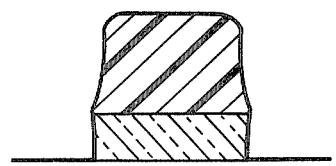
Figure 6C:
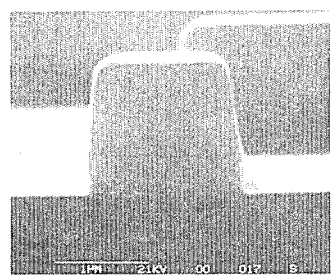
Figure 6C:
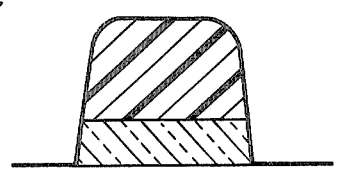

The process of the present invention is used to etch articles with comprise a substrate (20) with one or more layers thereon. (See FIG. 3.) The method permits the preferential etching of an elemental silicon-containing layer (24) of doped polysilicon or a refractory metal silicide over a covalent silicon-containing layer (22) such as SiO, $SiO_2$, silicon nitride, or silicon oxynitride. When the process is used in the preparation of patterned articles, a mask (26) of, for instance, a photoresist or electron beam resist material is applied on top of the upper layer.

5. Process

The process of the present invention is preferably carried out under vacuum at pressures between about 60 and 100 millitorr. Pressures higher than 100 millitorr ordinarily are not employed because they cause an excessive amount of polymer to coat out on the surfaces, as will be discussed hereinafter. Pressures lower than about 60 millitorr result in a reduction in selectivity.

The total flow rate of the gasses is generally 15 to 100 SCCM, preferably about 30 to 60 (standard conditions of 25° C. and 760 torr).

For mixtures containing $CClF_3$ the RF power supply was operated at a power density between about 0.2 and 0.3 watts/$cm^2$. For mixtures containing $CCl_2F_2$ the RF power supply was operated at a power density between about 0.125 and 0.3 watts/$cm^2$. However, this parameter will be dependent on the apparatus employed.

6. Working Examples

General conditions: A parallel plate, radial flow reactor was used. The space between the anode and the cathode was about 9-10 cm. All parts within the etch chamber are constructed of aluminum. RF power at 13.56 MHz is capacitatively coupled to the bottom electrode while the top electrode and chamber wall are well grounded. The power density is 0.22 W/$cm^2$. The etch gases are introduced through a manifold arrangement at the front of the chamber and evacuated at the back. Etch rates are measured from a laser interferometer trace or by measuring film thickness before and after etch on an IBM 3820 Film Thickness Analyzer. Selectivities are calculated from the measured etch rates.

The substrates are single crystal silicon wafers with <100< orientation. To obtain the MOS structure, 250 Angstroms of gate thermal oxide was grown. Then polysilicon was deposited using LPCVD at 625° C. The polysilicon was subsequently doped with $POCl_3$. The substrates in examples 1, 2, 3, 6, 7 and 8 had 4300 Angstroms of polysilicon. The substrates in examples 4, 5, 9 and 10 had 1700 Angstroms of polysilicon on which 2500 Angstroms of tungsten silicide was deposited using co-evaporation. The etchant for examples 1–5 was $CClF_3$ admixed with $NH_3$ an for examples 6–10 was $CCl_2F_2$ admixed with $NH_3$.

7. EXAMPLES

EXAMPLE 1

Pressure—60 mTorr
Flow rate—40 sccm
%$NH_3$—20%

An etch rate of 496 Angstroms/minute was realized in N+ polysilicon. The etch profile was vertical and the ERR of polysilicon to $SiO_2$ was 11:1.

EXAMPLE 2

Pressure—80 mTorr
Flow rate—40 sccm
%$NH_3$—35%

An etch rate of 540 Angstroms/minute was realized in N+ polysilicon. The etch profile was vertical and the ERR of polysilicon to $SiO_2$ was 18:1.

EXAMPLE 3

Pressure—100 mTorr
Flow rate—40 sccm
%$NH_3$—45%

An etch rate of 620 Angstroms/minute was realized in N+ polysilicon. The etch profile was vertical and the ERR of polysilicon to $SiO_2$ was 31:1.

EXAMPLE 4

Pressure—80 mTorr
Flow rate—40 sccm
%$NH_3$—35%

An etch rate of 540 Angstroms/minute was realized in tungsten silicide. The etch profile was vertical and the ERR of silicide to $SiO_2$ was 18:1.

EXAMPLE 5

Pressure—100 mTorr
Flow rate—40 sccm
%$NH_3$—45%

An etch rate of 620 Angstroms/minute was realized in tungsten silicide. The etch profile was vertical and the ERR of silicide to $SiO_2$ was 31:1.

EXAMPLE 6

Pressure—60 mTorr
Flow rate—40 sccm
%$NH_3$—20%

An etch rate of 490 Angstroms/minute was realized in N+ polysilicon. The etch profile was vertical and the ERR of polysilicon to $SiO_2$ was 11:1.

EXAMPLE 7

Pressure—80 mTorr
Flow rate—40 sccm

%NH$_3$—35%

An etch rate of 540 Angstroms/minute was realized in N+ polysilicon. The etch profile was vertical and the ERR of polysilicon to SiO$_2$ was 18:1.

EXAMPLE 8

Pressure—100 mTorr
Flow rate—40 sccm
%NH$_3$—45%

An etch rate of 620 Angstroms/minute was realized in N+ polysilicon. The etch profile was vertical and the ERR of polysilicon to SiO$_2$ was 31:1.

EXAMPLE 9

Pressure—80 mTorr
Flow rate—40 sccm
%NH$_3$—35%

An etch rate of 540 Angstroms/minute was realized in tungsten silicide. The etch profile was vertical and the ERR of silicide to SiO$_2$ was 18:1.

EXAMPLE 10

Pressure—100 mTorr
Flow rate—40 sccm
%NH$_3$—45%

An etch rate of 620 Angstroms/minute was realized in tungsten silicide. The etch profile was vertical and the ERR of silicide to SiO$_2$ was 31:1.

While the invention has been described in conjunction with a reactive ion etching apparatus, it will be understood that a variety of reactors may be employed satisfactorily. Different etching modes, including chemically based concepts like plasma etching and physically based concepts like reactive ion beam etching should be possible with the plasma environments disclosed. It is to be understood that the abovedescribed arrangements and procedures are only illustrative of the principles of the present invention. Various alterations in form and detail may be made without departing from the spirit and scope of the invention.

We claim:

1. An anisotropic gas plasma process carried out in a reactive ion etching mode using an etchant gas for selectively patterned etching of an elemental silicon-containing layer overlying a covalent silicon-containing layer, which layers form a surface of a semiconductor device, wherein the etchant comprises a gaseous chlorofluorocarbon capable of supplying CFx and chlorine ions in admixture with 20–65% of ammonia by volume at a pressure of from 60 to 100 millitorr.

2. The process of claim 1 wherein the chlorofluorocarbon is CClF$_3$.

3. The process of claim 2 wherein the mass flow rate is in the range of 15 to 100 sccm.

4. The process of claim 3 wherein the elemental silicon-containing layer comprises silicon, polysilicon, or a refractory metal silicide.

5. The process of claim 4 wherein the covalent silicon-containing layer comprises an oxide or nitride of silicon.

6. The process of claim 3 wherein the elemental silicon-containing layer is N+ polysilicon or tungsten silicide.

7. The process of claim 6 wherein the covalent silicon-containing layer is silicon dioxide.

8. The process of claim 7 wherein the power density is in the range of 0.2 to 0.3 W/cm$^2$.

9. The process of claim 1 wherein the mass flow rate is the range of 15 to 100 sccm.

10. The process of claim 1 wherein the elemental silicon-containing layer is silicon, polysilicon, or a refractory metal silicide.

11. The process of claim 1 wherein the covalent silicon-containing layer is an oxide or nitride of silicon.

12. The process of claim 1 wherein the elemental silicon-containing layer is N+ polysilicon or tungsten silicide.

13. The process of claim 1 wherein the covalent silicon-containing layer is silicon dioxide.

14. The process of claim 1 wherein the power density is in the range of 0.2 to 0.3 W/cm$^2$.

15. An anisotropic gas plasma process carried out in a reactive ion etching mode using an etchant gas for patterned selective etching of an elemental silicon-containing layer overlying a covalent silicon-containing layer, which layers form a surface of a semiconductor device, wherein the etchant comprises CCl$_2$F$_2$ in admixture with 20–65% of ammonia by volume at a pressure of 60 to 100 millitorr.

16. The process of claim 15 wherein the mass flow rate is in the range of 30 to 60 sccm.

17. The process of claim 16 wherein the elemental silicon-containing layer comprises silicon, polysilicon, or a refractory metal silicide.

18. The process of claim 17 wherein the covalent silicon-containing layer comprises an oxide or nitride of silicon.

19. The process of claim 16 wherein the elemental silicon-containing layer is N+ polysilicon or tungsten silicide.

20. The process of claim 19 wherein the covalent silicon-containing layer is silicon dioxide.

21. The process of claim 20 wherein the power density is in the range of 0.125 to 0.3 W/cm$^2$.

22. The process of claim 15 wherein the elemental silicon-containing layer is silicon, polysilicon, or a refractory metal silicide.

23. The process of claim 15 wherein the covalent silicon-containing layer is an oxide or nitride of silicon.

24. The process of claim 15 wherein the elemental silicon-containing layer is N+ polysilicon or tungsten silicide.

25. The process of claim 15 wherein the covalent silicon-containing layer is silicon dioxide.

26. The process of claim 15 wherein the power density is in the range of 0.125 to 0.3 W/cm$^2$.

* * * * *